United States Patent
Chen et al.

(10) Patent No.: US 10,114,068 B1
(45) Date of Patent: Oct. 30, 2018

(54) METHODS AND APPARATUS FOR MONITORING AGING EFFECTS ON AN INTEGRATED CIRCUIT

(71) Applicant: Altera Corporation, San Jose, CA (US)

(72) Inventors: Christopher Sun Young Chen, San Jose, CA (US); Jeffrey T. Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 988 days.

(21) Appl. No.: 13/973,822

(22) Filed: Aug. 22, 2013

(51) Int. Cl.
*G01R 31/28* (2006.01)

(52) U.S. Cl.
CPC ................................ *G01R 31/2879* (2013.01)

(58) Field of Classification Search
CPC .... G01R 31/2879; G01R 23/02; G01R 23/16; G01R 19/2513; G01R 23/00; G01R 23/10
See application file for complete search history.

(56) References Cited

U.S. PATENT DOCUMENTS

| 5,881,374 | A | 3/1999 | Osterberg | |
|---|---|---|---|---|
| 7,592,876 | B2 | 9/2009 | Newman | |
| 7,688,151 | B2 | 3/2010 | Lee | |
| 2010/0194400 | A1* | 8/2010 | Baumann | G01R 31/3181 324/537 |
| 2013/0208763 | A1* | 8/2013 | Uwe | G06K 19/0717 374/171 |
| 2014/0306687 | A1* | 10/2014 | Ahmadi | G01R 31/31727 324/76.11 |

* cited by examiner

*Primary Examiner* — Mohamed Charioui
*Assistant Examiner* — Jeremy Delozier

(57) ABSTRACT

An integrated circuit capable of monitoring aging effects on an integrated circuit device is disclosed. The integrated circuit includes a control circuit that obtains a clock signal at different frequencies. A sense circuit may receive the clock signal. First and second control signals may be asserted on the integrated circuit with the control circuit. The first control signal may activate a stress mode, and the second control signal may activate a measurement mode. During stress mode, the sense circuit may receive the clock signal. Any changes in predetermined electrical parameters of one or more transistors in the sense circuit may be monitored and measured during the measurement mode. Aging compensation may be performed when aging effect is detected on the sense circuit.

20 Claims, 8 Drawing Sheets

METHODS AND APPARATUS FOR MONITORING AGING EFFECTS ON AN INTEGRATED CIRCUIT

BACKGROUND

Generally, integrated circuits and electrical components may be designed based on operational margins to allow them to operate within specific operational parameters without causing permanent damage to their internal circuitry. For example, the maximum operating voltage of a design integrated circuit may be set based on the electrical characteristics such as threshold voltage of the transistors in the integrated circuit. However, the electrical characteristics of the transistors can be affected by various reliability mechanisms (also referred to as aging effect, or transistor aging) such as bias temperature instability (BTI), hot carrier injection (HCI), and time dependent dielectric breakdown (TDDB). These mechanisms can lead to transistor aging (i.e., changes in transistor electrical characteristics), resulting in possible performance degradation or failure of the integrated circuit.

As metal-oxide-semiconductor field-effect transistor (MOSFET) technology is scaled down, the variations caused by transistor aging can have an increasing effect on the design and performance of the integrated circuit. At short gate lengths (e.g. transistor gate lengths shorter than 50 nm), even relatively small variations caused by transistor aging can result in reduced operating speed for the integrated circuit, as well as increased failures at low operating voltages.

Typically, the performance degradation due to transistor aging can progressively increase as the integrated circuit is operated during its lifetime. For example, transistor aging caused by bias temperature instability (BTI) can lead to increased transistor threshold voltage. BTI can lead to degradation of both PMOS and NMOS transistors.

Generally, the degradations caused by BTI can be divided into two types—static BTI and dynamic BTI. Static BTI results from the application of a constant voltage stress, i.e., a DC bias voltage (typically a negative bias for PMOS and positive bias for NMOS) to the gate terminal of the transistor while also applying a lower DC bias voltage to the source and drain terminals of the transistor. Static BTI can degrade the gate oxide of a transistor (e.g., by trapping charges in the gate oxide), which leads to an increased threshold voltage and reduced drive current $I_{dsat}$. Dynamic BTI (i.e., frequency dependent aging) results from the application of a switching waveform (e.g, a clock waveform or an AC signal) to either the gate, source, or drain terminals of a transistor. Such increases in threshold voltage due to transistor aging can reduce the voltage overdrive and therefore, degrade the circuit stability and operating margin of the integrated circuit. Thus, both static and dynamic BTI can reduce the performance and yield of the integrated circuit.

SUMMARY

In accordance with embodiments of the present invention, methods and apparatus for monitoring aging effects on integrated circuits are provided.

It is appreciated that the present invention can be implemented in numerous ways such as a process, an apparatus, a system, a device, or a method on a computer readable medium. Several inventive embodiments of the present invention are described below.

An integrated circuit may include a control circuit that obtains a clock signal and a sense circuit that receives the clock signal. The sense circuit may operate in two modes. The first mode may be a stress mode and the second mode may be a measurement mode. The clock signal may be coupled to the sense circuit during the stress mode. Changes in predetermined electrical parameters of one or more transistors in the sense circuit are measured during the measurement mode.

A method of operating an integrated circuit is provided. The method includes obtaining a clock signal with a clock circuit. An aging monitor circuit may stress a sense circuit by receiving the clock signal and by passing the clock signal through the sense circuit. The output frequency of oscillation of the sense circuit may be monitored for aging effects when a measurement mode is activated on the aging monitor circuit.

A method for monitoring aging effects on an integrated circuit device under test is also provided. The method includes receiving a clock signal for testing and outputting a signal having a frequency. The method may further include monitoring the aging effects associated with the sense circuit by monitoring the frequency of the signal that is output from the sense circuit. When an aging effect is detected, aging compensation may be performed on the degraded integrated circuit device using aging compensation circuit in order to satisfy various performance criteria.

Further features of the invention, its nature and various advantages, will be more apparent from the accompanying drawings and the following detailed description of the preferred embodiments.

DETAILED DESCRIPTION

The embodiments provided herein include circuitry and techniques for monitoring aging effects on an integrated circuit.

It will be obvious to one skilled in the art that the present exemplary embodiments may be practiced without some or all of these specific details. In other instances, well-known operations have not been described in detail in order not to unnecessarily obscure the present embodiments.

Figure 1:
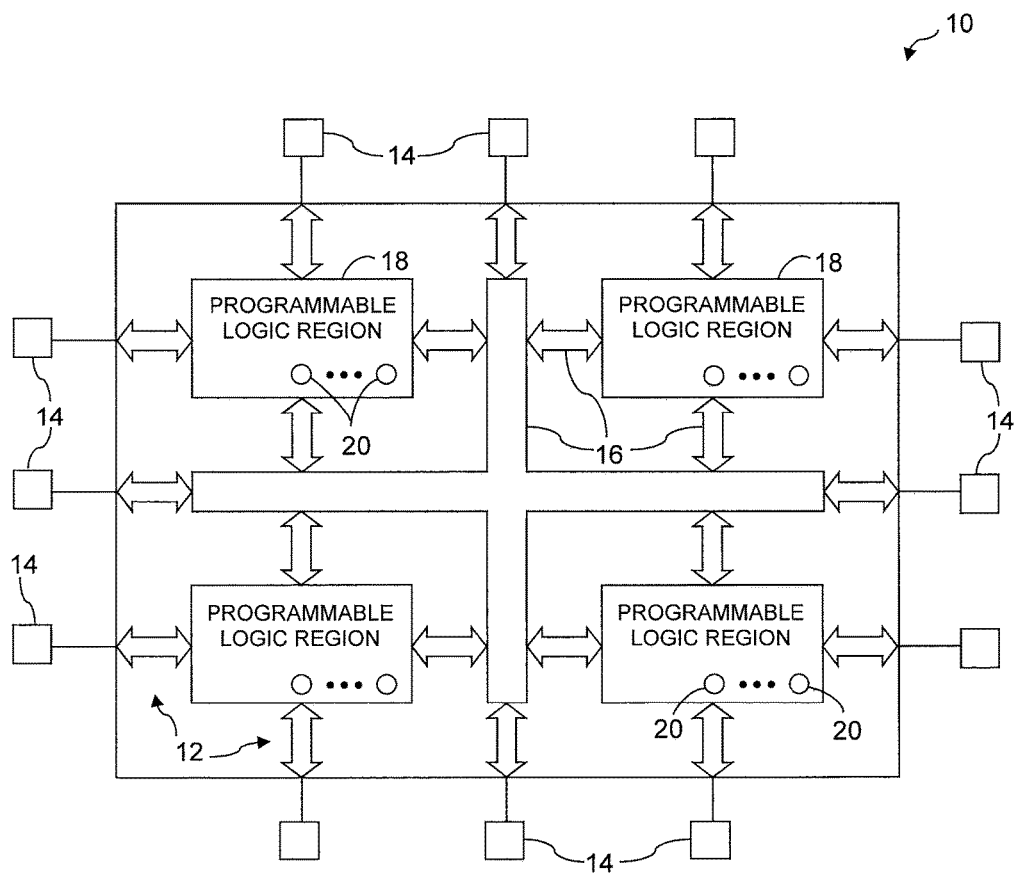
FIG. 1 is a diagram of an illustrative integrated circuit in accordance with an embodiment of the present invention.

FIG. 1 is a diagram of an illustrative integrated circuit 10 in accordance with an embodiment of the present invention. Integrated circuit 10 may have input/output circuitry 12 for driving signals off of integrated circuit 10 and for receiving signals from other circuits or devices via input/output pins 14. Interconnection resources 16 such as global and local vertical and horizontal conductive lines and busses may be used to route signals on device 10. Interconnection resources 16 include fixed interconnects (conductive lines) and programmable interconnects (e.g., programmable connections between respective fixed interconnects). Programmable logic regions 18 may include combinational and sequential logic circuitry. Programmable logic regions 18 may be configured to perform custom logic functions. The programmable interconnects associated with interconnection resources 16 may be considered to be part of respective programmable logic regions 18.

A typical memory element 20 is formed from a number of transistors configured to form cross-coupled inverters. For example, complementary metal-oxide-semiconductor (CMOS) integrated circuit technology may be used to form memory elements 20 with one suitable approach. In the context of programmable logic devices, the memory elements may store configuration data and are therefore sometimes referred to as configuration random-access memory (CRAM) cells.

Memory elements 20 are generally arranged in an array pattern. In a programmable logic device, there may be millions of memory elements 20 on a single device. A user (e.g., a logic designer) may provide configuration data for the array of memory elements during programming operation. Once loaded with configuration data, memory elements 20 may selectively control (e.g., turn on and off) portions of the circuitry in programmable logic regions 18 and thereby customize its functions as desired.

When memory elements 20 are arranged in an array, horizontal and vertical conductors and associated control circuitry may be used to access memory elements 20. The control circuitry may, for example, be used to clear all or some of the memory elements. The control circuitry may also write data to memory elements 20 and may read data from memory elements 20. For example, in CRAM arrays, memory elements 20 may be loaded with configuration data. The loaded configuration data may then be read out from the memory arrays to confirm proper data capture before integrated circuit 10 is used during normal operation in a system.

The circuitry of integrated circuit 10 may be organized using any suitable architecture. For instance, programmable logic regions 18 may be organized in a series of rows and columns of relatively large programmable logic regions, each of which contains multiple smaller regions. The larger regions are sometimes referred to as logic array blocks. The smaller logic regions are sometimes referred to as logic elements. A typical logic element may contain a look-up table, registers, and programmable multiplexers. If desired, programmable logic regions 18 may be arranged in more levels or layers in which multiple large regions are interconnected to form still larger portions of logic.

Figure 2:
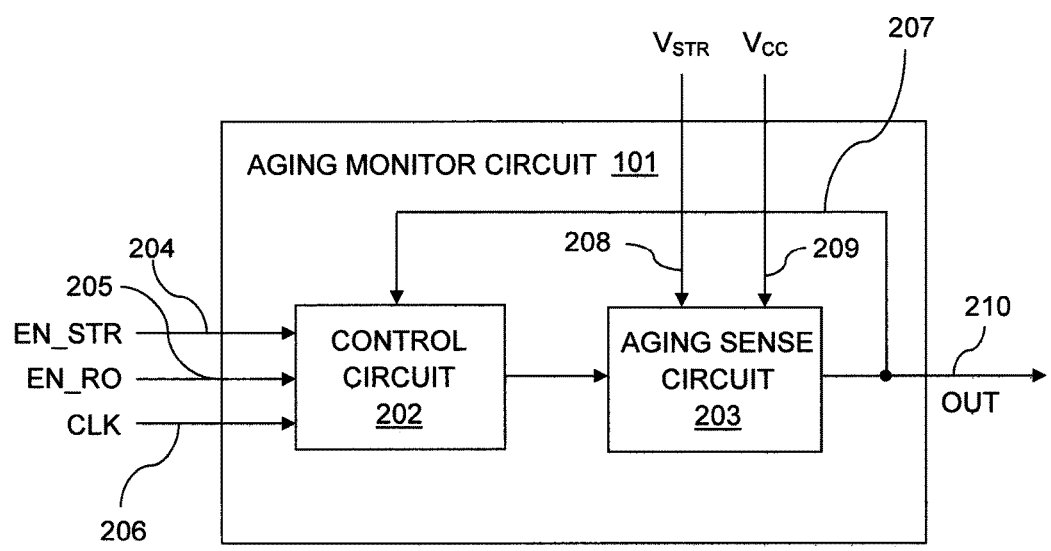
FIG. 2 is a block diagram of an illustrative aging monitor circuit in accordance with an embodiment of the present invention.

FIG. 2 is a block diagram of an illustrative aging monitor circuit 101 in accordance with one embodiment. Aging monitor circuit 101 can be used to monitor the effects of frequency dependent aging and aging caused by voltage stress, such as dynamic and static bias temperature instability (BTI). The aging monitor circuit 101 includes control circuit 202 coupled to aging sense circuit 203. The aging monitor circuit 101 may be incorporated into an integrated circuit to monitor for the effects of transistor aging as the integrated circuit is operated during normal operation.

Control circuit 202 may be configured to receive a stress-enable signal EN_STR at input terminal 204, a ring oscillator enable signal EN_RO at input terminal 205, and a clock signal CLK at input terminal 206. In one embodiment, the control circuit 202 receives signal CLK from an external signal generator that is not fabricated on the integrated circuit. In an alternative embodiment, the control circuit 202 receives signal CLK from on-chip clock generation circuitry. In other embodiments, the control circuit 202 can be cofigured (e.g., based on user input) to receive signal CLK from either an external signal generator or an on-chip clock generator.

Aging sense circuit 203 is coupled to control circuit 202. In one embodiment, aging sense circuit 203 receives an input signal from control circuit 202. The aging sense circuit 203 has —a first input that receives a stress voltage $V_{STR}$ via path 208 and a second input that receives a power supply voltage $V_{CC}$ via path 209. In one embodiment, the input voltage signals $V_{STR}$ and $V_{CC}$ may have different voltage levels, respectively.

In an exemplary embodiment, aging monitor circuit 101 may be configured to monitor either static or dynamic BTI, in accordance with the values of the input signals received by control circuit 202 and the aging sense circuit 203. For example, a predetermined voltage (e.g., a negative bias voltage or VSS) can be applied to the stress voltage input $V_{STR}$ to cause static BTI related transistor aging of the transistors in the aging sense circuit 203. As an alternative example, signal EN_STR may selectively activate a dynamic stress operation on aging sense circuit 203, where the switching waveform received at input terminal 206 is applied to the aging sense circuit 203. The output of the aging sense circuit 203 can be selectively coupled to the control circuit 202, e.g., using connection 207, to measure predetermined performance characteristics of the aging sense circuit 203, and therefore, measure the effects of transistor aging. In one embodiment, asserting signal EN_RO activates the measurement operation on aging sense circuit 203.

When the dynamic stress operation is activated, aging sense circuit 203 is stressed by signal CLK. In one embodiment, signal CLK may be injected into aging sense circuit 203 at different frequencies. In addition, signals $V_{STR}$ and $V_{CC}$ may be coupled to predetermined power supply voltages to include both static and dynamic stress as part of the stress operation. In one embodiment, effects of transistor aging are measured without interrupting the stress operation (e.g. by asserting signals EN_RO and EN_STR simultaneously). In an alternative embodiment, the stress operation is interrupted while the transistor aging measurement operation is performed. Typically, the transistor aging measurement operation is performed after the static and/or dynamic stress operations have been performed for a predetermined number or clock cycles, or a predetermined duration of time.

In one embodiment, aging monitor circuit 101 operates as a closed-loop ring oscillator when the measurement operation is activated. When signal EN_RO is asserted and signal EN_STR is deasserted, the feedback signal from aging sense circuit 203 is coupled to control circuit 202 via feedback path 207. Feedback path 207 can be selectively used as the feedback path for a ring oscillator that includes the aging sense circuit 203 as one of the delay elements, such that the natural oscillation frequency of the ring oscillator depends on the electrical performance characteristics (e.g., threshold voltage or drive current) of the transistors in the aging sense circuit 203. Therefore, the natural oscillation frequency of the ring oscillator during measurement operation changes with static and dynamic transistor aging of the transistors in the aging sense circuit 203.

Figure 3A:
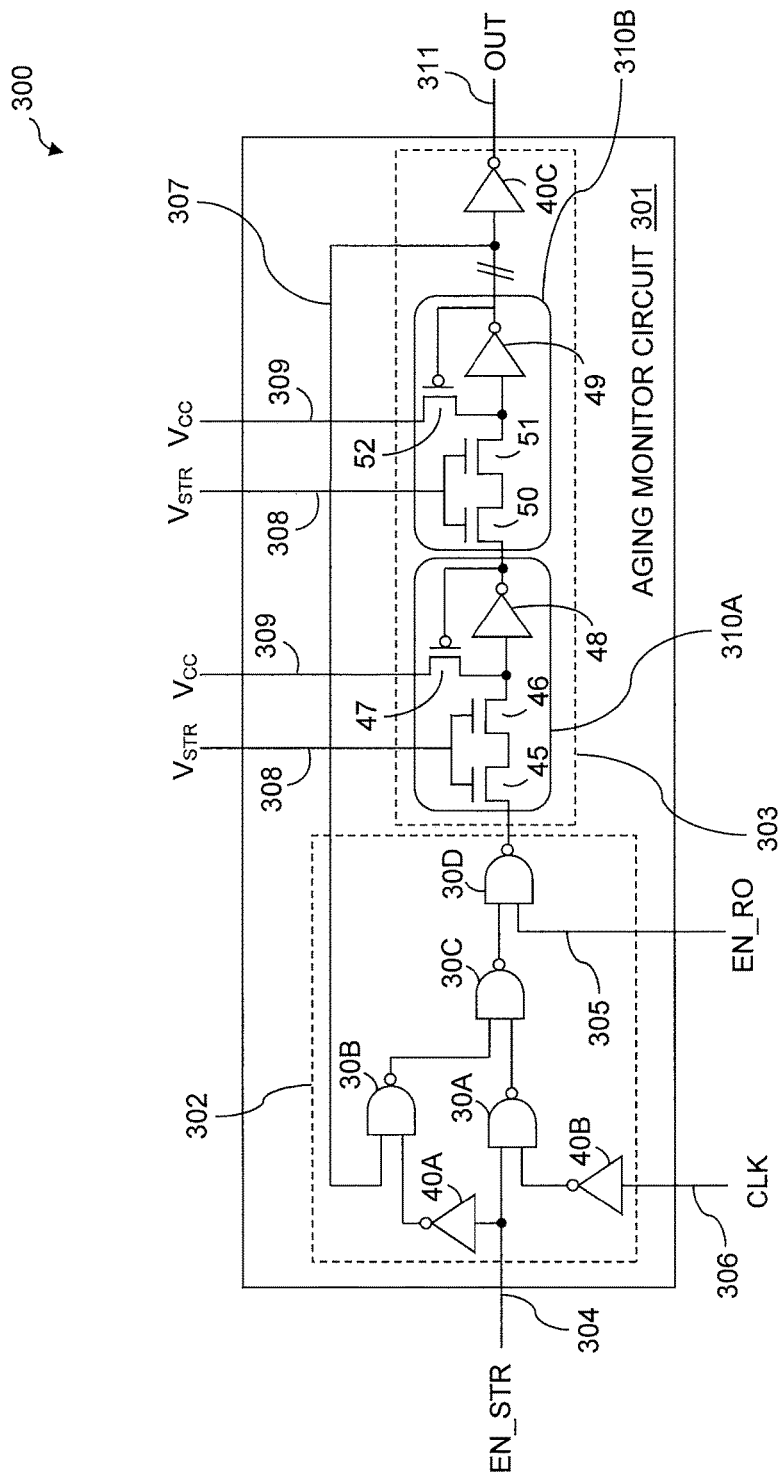
FIG. 3A is a schematic block diagram of an illustrative aging monitor circuit in accordance with an embodiment of the present invention.

FIG. 3A is a schematic block diagram 300 of an illustrative aging monitor circuit (e.g., aging monitor circuit 101 of FIG. 2) in accordance with one embodiment. Aging monitor circuit 301 includes control circuit 302 and aging sense circuit 303. Control circuit 302 includes inverter 40B, which is configured to receive signal CLK via path 306, and NAND gate 30A, which receives the inverted clock signal from inverter 40B and signal EN_STR via path 304. NAND gate 30A logically combines signal EN_STR and the inverted clock signal from inverter 40B and applies the resulting output signal to one of the input terminals of NAND gate 30C. Signal EN_STR, which is inverted by inverter 40A, is provided as an input to NAND gate 30B. The output of NAND gate 30B is coupled to an input terminal of NAND gate 30C. Subsequently, the output of NAND gate 30C is coupled to an input terminal of NAND gate 30D. Signal EN_RO is provided to another input terminal of NAND gate 30D via path 305. The resulting output signal of NAND gate 30D is supplied to aging sense circuit 303.

In general, integrated circuits may be made up of basic cells that include, among others, transistors, interconnections and other electrical components. In the embodiment shown in FIG. 3A, aging sense circuit 303 may include two basic cells (e.g., basic cells 310A and 310B). As an example, basic cell 310A may contain two NMOS pass gates 45 and 46, a PMOS pull-up transistor (sometimes referred to as a "keeper" transistor) 47, and an inverter 48. Basic cell 310B may also contain two NMOS pass gates 50 and 51, a PMOS pull-up transistor 52 and an inverter 49. Basic cell 310B may operate similarly to basic cell 310A. It should be noted that the three NAND gates (e.g., NAND gates 30B, 30C, and 30D), in combination with basic cells 310A and 310B provide an odd number of inverter delays, and therefore, the aging monitor circuit can be configured to operate as a ring oscillator that includes aging sense circuit 303.

In alternative embodiments, aging sense circuit 303 can include more than two basic cells. It should be appreciated that alternative embodiments of aging sense circuit 303 may be implemented with transistor configurations that are different from the configuration shown in FIG. 3A, as long as the electrical performance characteristics of the basic cells (e.g., basic cells 310A and 310B) are affected by transistor aging.

Aging sense circuit 303 may be powered with a standard power supply voltage (e.g., voltage range between −0.5V to 1.35V). For example, a power supply voltage Vcc may be supplied to basic cells 310A and 310B. Positive power supply voltage Vcc may also be used to power other circuitries within aging sense circuit 303. A stress voltage such as voltage $V_{STR}$ may also be supplied to aging sense circuit 303 from an on-chip voltage source. For example, the gates of the respective NMOS pass transistors in basic cells 310A and 310B may be held at voltage level $V_{STR}$ to allow clock signal 306 to pass through.

In one embodiment, aging monitor circuit 301 may operate in two different modes in order to perform an aging test on aging sense circuit 303. For example, aging monitor circuit 301 may operate in stress mode or measurement mode, depending on the logic levels of signals EN_STR and EN_RO. Aging sense circuit 303 may be coupled to control circuit 302 and may be used to perform a stress test based on the received output signal from NAND gate 30D.

As an example, when signals EN_RO and EN_STR are set to a logic high level (e.g., when the binary bits of EN_RO and EN_STR are set to "1"), the stress mode may be activated on aging monitor circuit 301. For example, the stress mode may trigger aging sense circuit 303 to perform a stress test. In this mode, NAND gates 30A-30D may form a delay chain by disabling feedback path 307.

Alternatively, the measurement mode may be activated on aging monitor circuit 301 when signal EN_RO is set to a logic high level and when signal EN_STR is set to a logic low level (e.g., when the binary bit of EN_STR is set to "0"). In one embodiment, aging monitor circuit 301 may act as a closed-loop ring oscillator when the measurement mode is activated. For example, three NAND gates (e.g., NAND gates 30A, 30C and 30D) may function as inverters. This configuration may couple to inverters 38 and 49 of basic cells 310A and 310B to function as a ring oscillator, by forming a feedback path (e.g., feedback path 307) to control circuit 302. Accordingly, each output signal produced by aging sense circuit 303 may be inverted by inverter 40C, creating a natural oscillation frequency or output signal OUT at output terminal 311. Aging sense circuit 303 may be measured for aging effect by comparing output signal OUT to an initial oscillation frequency of the circuit.

Figure 3B:
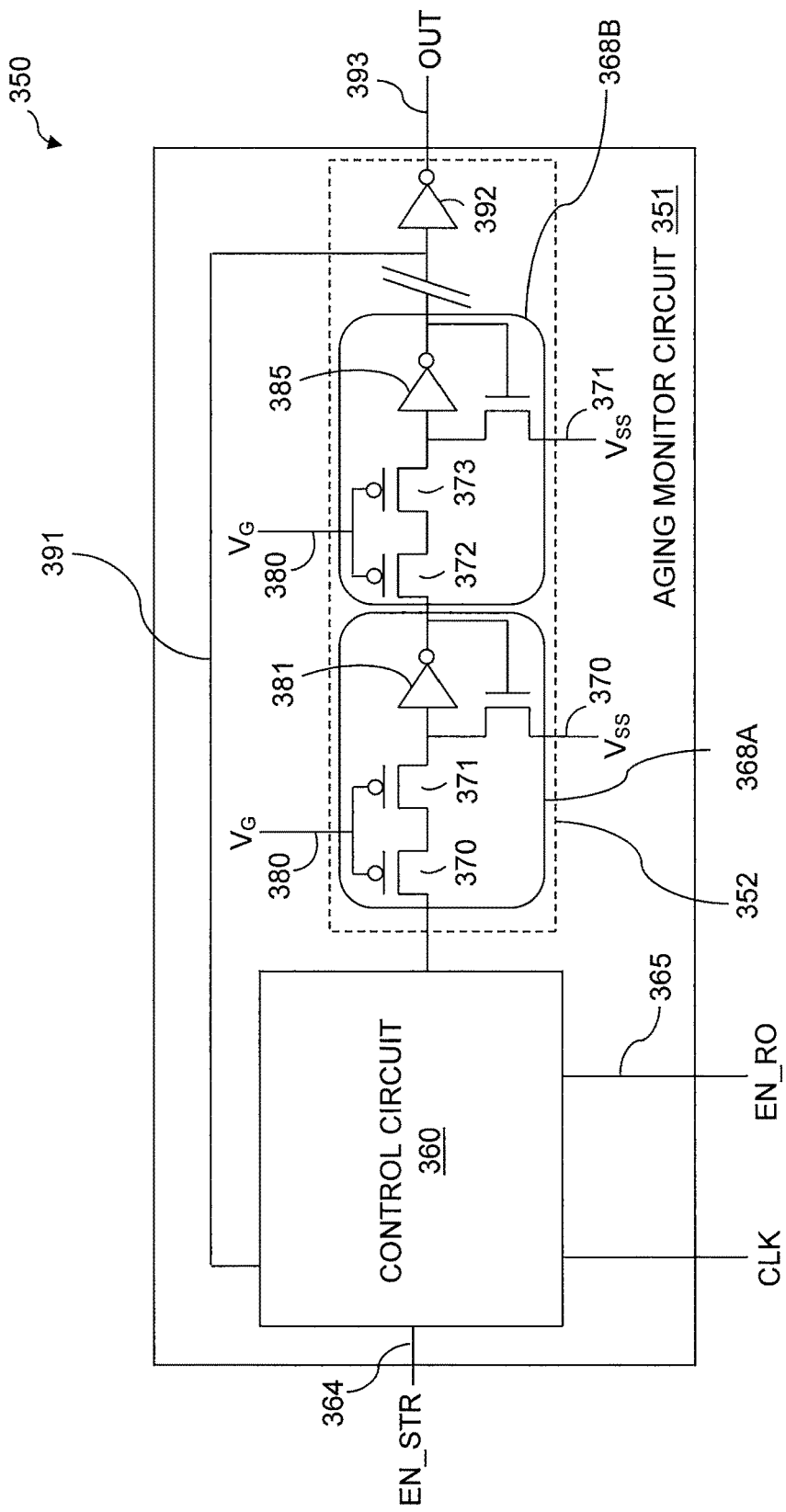
FIG. 3B is a schematic block diagram showing yet another suitable arrangement of an aging monitor circuit in accordance with an embodiment of the present invention.

FIG. 3B is a schematic block diagram showing yet another suitable arrangement of an aging monitor circuit. It should be appreciated that aging monitor circuit 351 may operate analogously as aging monitor circuit 301 of FIG. 3A. For example, control circuit 360 may have similar configuration and functionality as control circuit 302 of FIG. 3A.

As shown in the embodiment of FIG. 3B, aging sense circuit 352 may include two basic cells (e.g., basic cells 368A and 368B). As an example, basic cell 368A may contain two PMOS pass gates 370 and 371, an NMOS keeper 370 and an inverter 381. Basic cell 368B may also contain two PMOS pass gates 372 and 373, an NMOS keeper 371 and an inverter 385. Basic cell 368B may operate similarly to basic cell 368A.

During an aging test operation, an integrated circuit may be tested for aging effects. Control circuit 360 may receive input signals from external circuitry. Control circuit 360 may accordingly transmit input signals as control signals to aging sense circuit 352. In one embodiment, the control signals may include a stress-enable signal (e.g., stress-enable signal EN_STR provided on path 364) and a ring oscillator enable signal (e.g., RO enable signal EN_RO provided on path 365). Each enable signal may place the integrated circuit in an open loop stress mode or a closed loop measurement mode. For example, signals EN_RO and EN_STR are asserted to activate a stress mode on aging monitor circuit 351. During this operation, negative voltage $V_G$ is turned on, causing voltage current to flow between the source and drain of respective PMOS transistors in basic cells 368A and 368B. For example, a negative gate voltage $V_G$ may be applied at control terminal 380 as part of the stress operation. The gates of the PMOS pass transistors in basic cells 368A and 368B may be held at the bias level of signal $V_G$ to allow clock signal CLK to pass through.

In contrast, when enable signal EN_RO is asserted and when enable signal EN_STR is deasserted, the measurement operation is activated on aging monitor circuit 351. In this mode of operation, aging monitor circuit 351 may act as a closed-loop ring oscillator. The ring oscillator is formed by coupling a feedback path (e.g., feedback path 391) to control circuit 360 and its natural oscillation frequency is measured. For example, as shown in FIG. 3B, aging monitor 351 may generate output signal OUT at output terminal 393 and the oscillation frequency of output signal OUT may be measured for aging effect.

Figure 4:
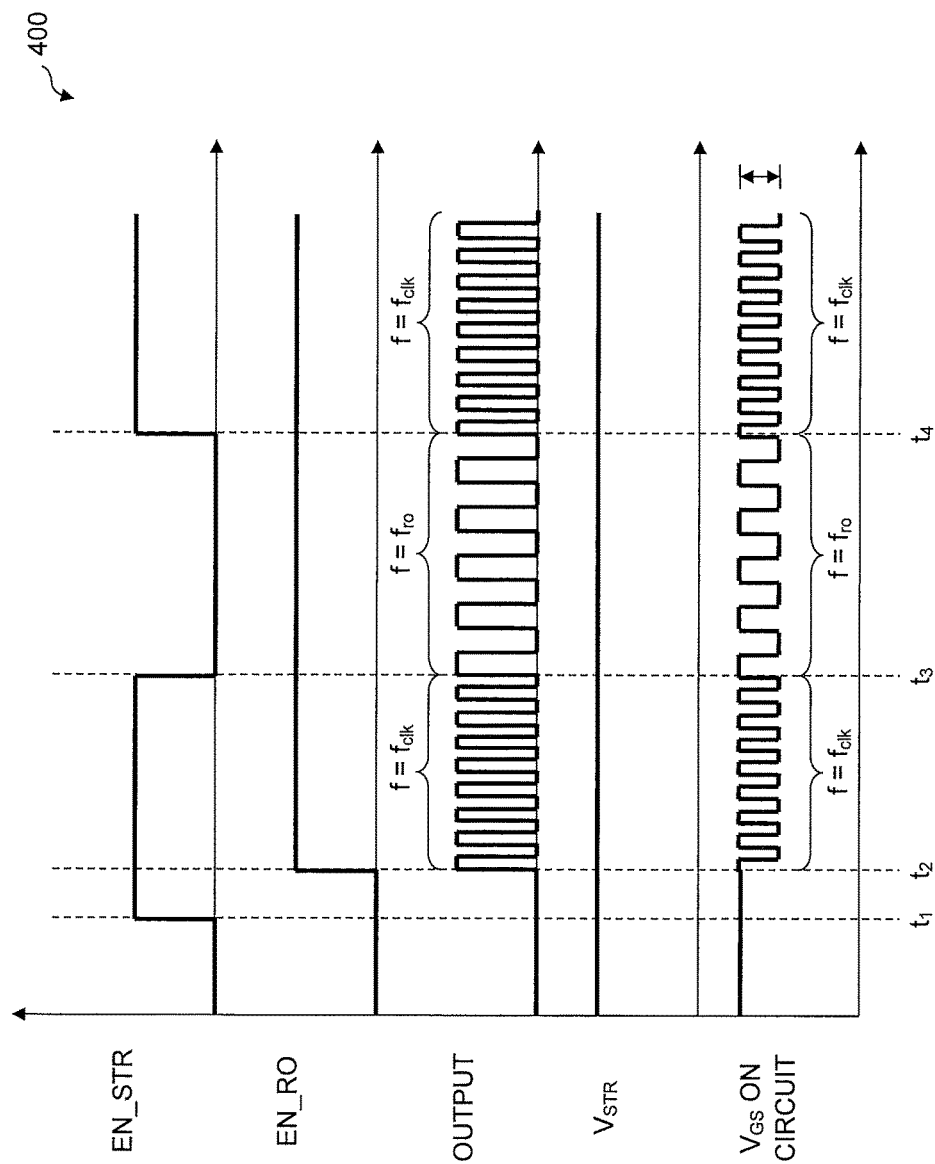
FIG. 4 is a timing diagram illustrating an aging test that is performed on an integrated circuit in accordance with an embodiment of the present invention.

FIG. 4 shows a timing diagram 400 that illustrates signal waveforms at the output of aging monitor circuit 301 during an aging test. Similar timing diagrams may also be obtained for other embodiments of the aging monitor circuit descried herein. Timing diagram 400 shows a stress-enable signal (e.g., EN_STR) and a ring oscillator enable signal (e.g., EN_RO). Clock signals with adjustable frequencies (e.g., clock signal CLK of FIGS. 3A and 3B) and stress voltage (e.g., $V_{STR}$) may be used to make dynamic and static stress measurements (e.g., dynamic and static BTI) during the aging test.

When the aging monitor circuit (e.g., aging monitor circuits 101, 301 and 351 of FIGS. 2, 3A, and 3B, respectively) is powered up, the elements within the aging monitor circuit may be reset to their respective initial states. For example, the binary values of input signals EN_STR and EN_RO may be reset to "0", respectively. In this scenario, signal OUTPUT, may not be at a logic low level (or at an inactive state) even though EN_STR is turned on at the time interval between $T_1$ and $T_2$.

When both signals EN_STR and EN_RO are at a logic high level, a stress mode may be activated on the aging monitor circuit. For example, in the embodiment of FIG. 3A, when EN_STR is set to "1", the gates of the respective pass transistors in aging sense circuit 303 may be held at a stress voltage level $V_{STR}$ and clock signal CLK may be able to pass through aging sense circuit 303. As shown in timing diagram 400, the resulting output frequency of aging sense circuit 303 may be relatively higher from the time interval between $T_2$ to $T_3$ when aging sense circuit 303 is stressed. It should be appreciated that the resulting output signal may have the same frequency as the frequency of the clock signal (e.g., $f_{clk}$) supplied to aging sense circuit 303.

Alternatively, aging monitor circuit may also operate in measurement mode, in accordance with one embodiment. By setting EN_STR to "0" and EN_RO to "1", a feedback signal may be coupled from aging sense circuit 303 to control circuit 302. This may result in signal OUTPUT with a natural oscillation frequency $f_{ro}$ from aging monitor circuit 301 as a result of the ring oscillator formed by the coupled feedback signal (see, e.g., signal OUTPUT from time $T_3$ and $T_4$). In one embodiment, $f_{clk}$ and $f_{ro}$ may be of different frequency (e.g., $f_{clk} > f_{ro}$). The natural oscillation frequency may be measured and compared to a predetermined threshold to determine whether aging sense circuit 303 satisfies specific performance criteria.

As shown in timing diagram 400, $V_{STR}$ that is supplied to the gate of the respective pass transistors in basic cells 310A-310B of FIG. 3A and may be maintained at a constant voltage level (e.g., a voltage high level). As the gates of the respective pass transistors are held at $V_{STR}$, the gate-to-source voltage $V_{GS}$ of the pass transistors may toggle between $V_{STR}$ and $V_{STR}$ minus power supply voltage Vcc. For example, the source terminal of the respective pass transistors may toggle between 0 volt and Vcc. The gate-to-source voltage $V_{GS}$ is a voltage between the gate terminal and the source terminal of the pass transistors, as persons of ordinary skill in the art understand.

Figure 5:
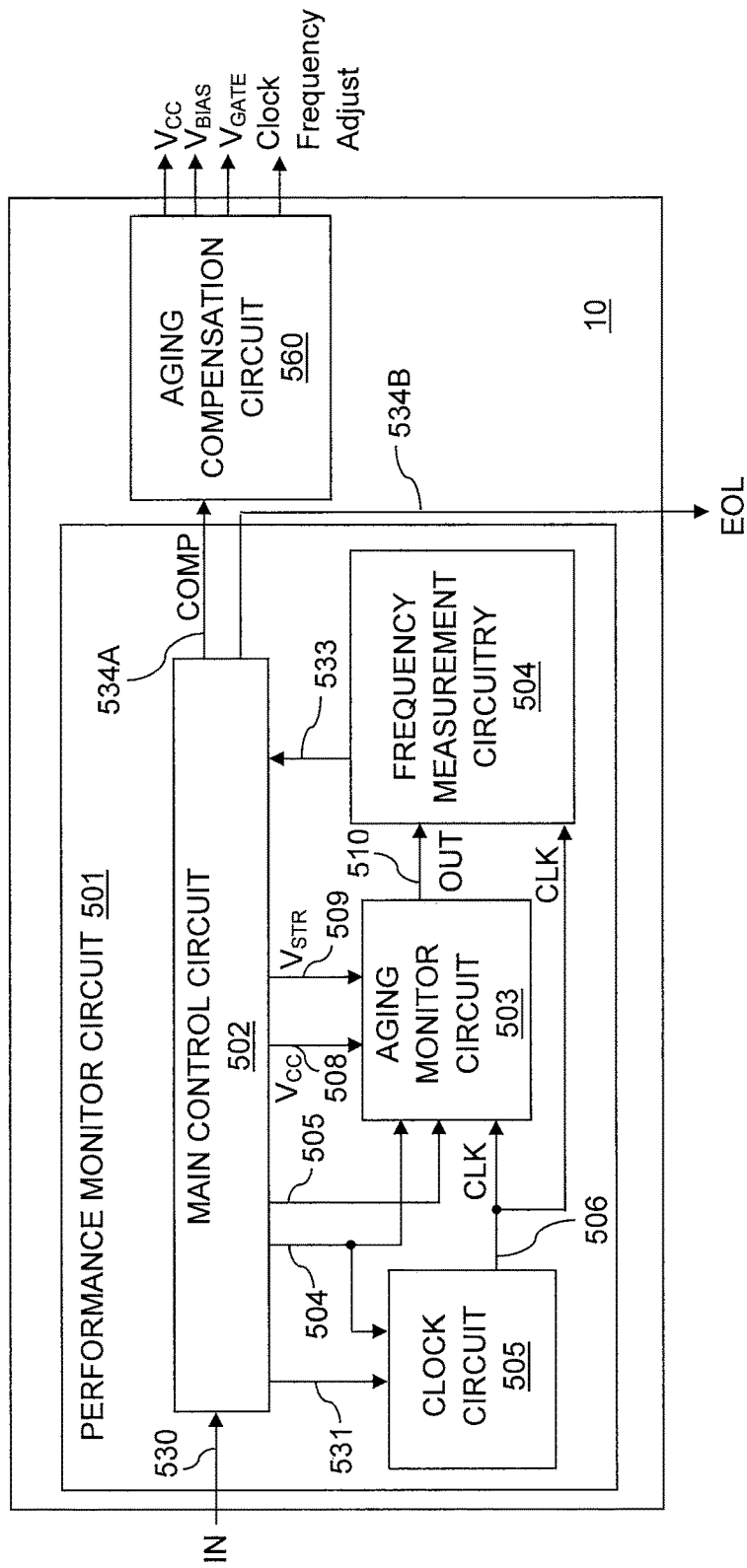
FIG. 5 is a diagram of illustrative signal monitoring circuitry in accordance with an embodiment of the present invention.

FIG. 5 shows a block diagram of an integrated circuit 10 that includes a performance monitor circuit 501 and an aging compensation circuit 560, in accordance with one embodiment. The performance monitor circuit 501 and the aging compensation circuit 560 can be fabricated on the integrated circuit to monitor transistor aging and compensate for transistor aging during normal operation of the integrated circuit 10. The aging compensation circuit receives an aging compensation signal COMP via path 534A from the aging monitor circuit 501. If the signal COMP indicates that the transistor electrical parameters are outside a predetermined target range, the aging compensation circuit 560 compensates for the transistor aging effect and restores the transistor electrical parameters to the predetermined target range. In one embodiment, the aging compensation circuit 560 generates an "End of Life" alert signal such as signal EOL for the user if the transistor electrical parameters are outside the predetermined range. It should be appreciated that aging monitor circuit 503 may be implemented in accordance with the embodiments described above with reference to FIGS. 2 and 3.

As shown in FIG. 5, performance monitor circuitry 501 may include main control circuit 502, clock circuit 505, aging monitor circuit 503 and frequency measurement circuitry 504. It should be appreciated that control circuit 502 may receive input signals IN at input terminal 530 from external circuitry. Main control circuit 502 may accordingly transmit input signals IN as control signals to various circuit components within performance monitor circuit 501 (e.g., clock circuit 505 and aging monitor circuit 503) that may be used to monitor aging effects on the device. In one embodiment, the control signals output by main control circuit 502 may include a stress-enable signal such as EN_STR provided over path 504, a ring oscillator enable signal such as EN_RO provided over path 505, a power supply voltage such as Vcc provided over path 508 and a stress voltage such as $V_{STR}$ that is provided over path 509. In one embodiment, input signals IN may include other information that is used to configure main control circuit 502 at any given time. For example, input signals IN may select a frequency value for clock circuit 505 during the generation of signal CLK.

During an aging test operation, a user may test an integrated circuit for aging effects by stressing the integrated circuit using signal CLK via path 506 and stress voltage $V_{STR}$ 509. To activate a stress operation, aging monitor circuit 503 may receive the stress enable signal (e.g., EN_STR 504) from control circuit 502. In response to EN_STR 504, control circuit 502 may also trigger clock circuit 505 to generate signal CLK. The user may adjust the frequency of signal CLK by controlling frequency selector signal 531.

When performance monitor circuit 501 is performing an aging test, an output signal (e.g., OUT 510) may be generated. In one embodiment, the output signal is the natural oscillation frequency of aging sense circuit 503. This frequency may be measured when aging monitor circuit 503 is operating under the measurement mode. To measure its frequency, the output signal OUT 510 may then be transmitted to frequency measurement circuitry 504.

In one embodiment, frequency measurement circuitry 504 may perform a comparison between the frequency of output signal OUT 510 with a predetermined threshold frequency to determine whether the aging monitor circuit 503 satisfies specific performance criteria. As shown in FIG. 5, signal CLK may be supplied to frequency measurement frequency 504 and the frequency of signal CLK may be used as the predetermined threshold frequency for comparison with output signal OUT 510. Subsequently, frequency measurement circuitry 504 may generate a measured frequency signal and transmit to main control circuit 502 via path 533.

In one embodiment, the measured frequency signal is the result of the comparison between signal CLK and output signal OUT.

Based on the received measured frequency signal, main control circuit 502 may transmit an appropriate instruction signal (e.g., COMP or EOL) as an output of aging monitor circuit 501. For example, when an aging effect is detected on aging monitor circuit 503 in performance monitor circuit 501, main control circuit 502 may generate signal EOL via path 534B to notify the user that aging monitor circuit 503 suffers from speed degradation. In this scenario, the user may choose to perform an aging compensation operation on the degraded circuit.

In one embodiment, main control circuit 502 may transmit instruction signal COMP via path 534A to trigger aging compensation circuit 560 to perform an aging compensation operation on the circuit when an aging effect is detected. For example, aging compensation circuit 560 may compensate for the aging effect by increasing the voltage level of Vcc or adjusting the gate voltage (e.g., $V_G$ of FIG. 3B) to increase the speed of the respective pass transistors. Aging compensation circuit 560 may also adjust the body bias voltage of the respective pass transistors in the aging sense circuit or the pass gate control voltage (e.g., $V_{STR}$). Another example of an aging compensation operation that may be performed by aging compensation circuit 560 on aging monitor circuit 503 is to adjust its operating clock frequency.

Figure 6:
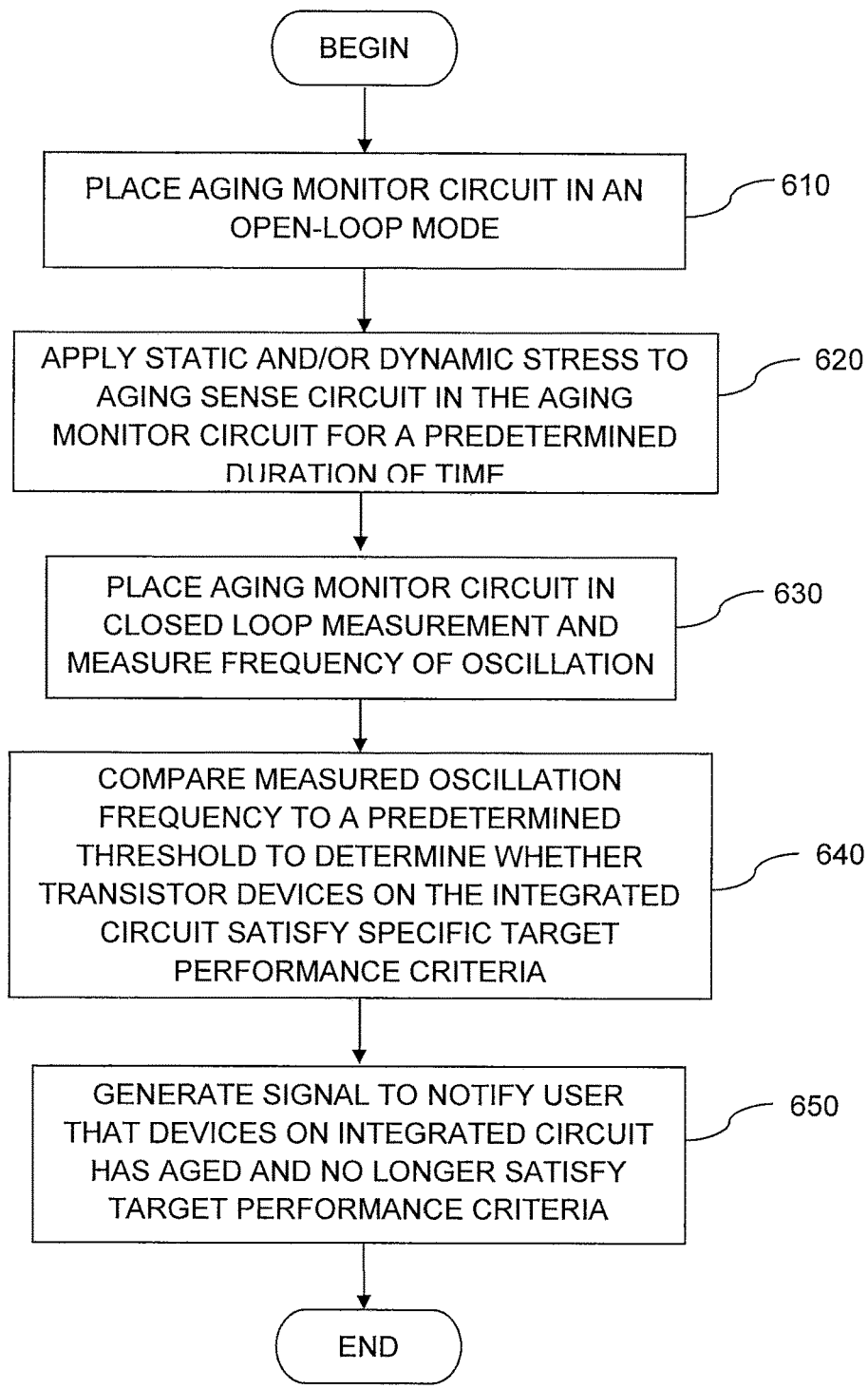
FIG. 6 is a flow chart of illustrative steps for monitoring aging effects on a circuit under test in accordance with an embodiment of the present invention.

Illustrative steps involved in monitoring aging effects on a aging sense circuit are shown in FIG. 6. At step 610, an aging monitor circuit is placed in an open-loop mode. In the embodiment of FIG. 2, signals EN_RO and EN_STR may be asserted to cause aging monitor circuit 101 to function in open-loop mode.

At step 620, static and/or dynamic stress signals are applied to an aging sense circuit in the aging monitor circuit for a predetermined duration of time. In certain embodiments, various combinations of static and dynamic stress can be applied to the aging sense circuit, such as only static stress, only dynamic stress, both static and dynamic stress applied simultaneously, or static stress for a first predetermined duration of time followed by dynamic stress applied for a second predetermined duration of time. In the embodiment of FIG. 3A, static or dynamic stress can be applied to the aging sense circuit 303 by applying a predetermined stress voltage to the node $V_{STR}$. Static stress can be applied by applying a fixed voltage 0V or $V_{CC}$ to the node CLK, and dynamic stress can be applied by applying a switching waveform having a predetermined frequency to the clock signal CLK.

At step 630, the aging monitor circuit is placed in measurement mode and the frequency of oscillation is measured. In the embodiment of FIG. 3A, when control circuit 302 deasserts signal EN_STR to aging monitor circuit 301, a measurement operation may be performed on aging monitor circuit 301. During this mode of operation, aging monitor circuit 301 may form a closed loop circuit and its oscillation frequency is measured at step 630. As shown in FIG. 5, aging monitor circuit 503 may generate output signal OUT and the oscillation frequency of output signal OUT may be measured by frequency measurement circuitry 504.

At step 640, the measured oscillation frequency of the output signal is evaluated to determine whether the transistor devices on the integrated circuit satisfy target performance criteria. In one embodiment, the measured oscillation frequency is used to determine the threshold voltage of the transistors in the aging sense circuit (such as transistors 45, 46, 50, and 51 of FIG. 3A), and step 640 determines whether the threshold voltage of these transistors is within a target range for the integrated circuit. In alternative embodiments, other transistor parameters of these transistors can be evaluated in a similar manner. For example in the embodiment of FIG. 5, the oscillation frequency of output signal OUT received from performance monitor circuit 501 may be read and measured by frequency measurement circuitry 504 and the resulting measurement may be compared with an initial oscillation frequency of the aging sense circuit (e.g., aging sense circuit 203 of FIG. 2).

At step 650, a signal is generated to notify a user that as a result of transistor aging the transistor devices on the integrated circuit and may no longer satisfy the target performance criteria. In the embodiment of FIG. 5, if the result of frequency measurement circuitry 504 shows that the tested devices on the integrated circuit have aged, main control circuit 502 may generate an alert signal (e.g., signal EOL) to notify the user that the integrated circuit has degraded.

Figure 7:
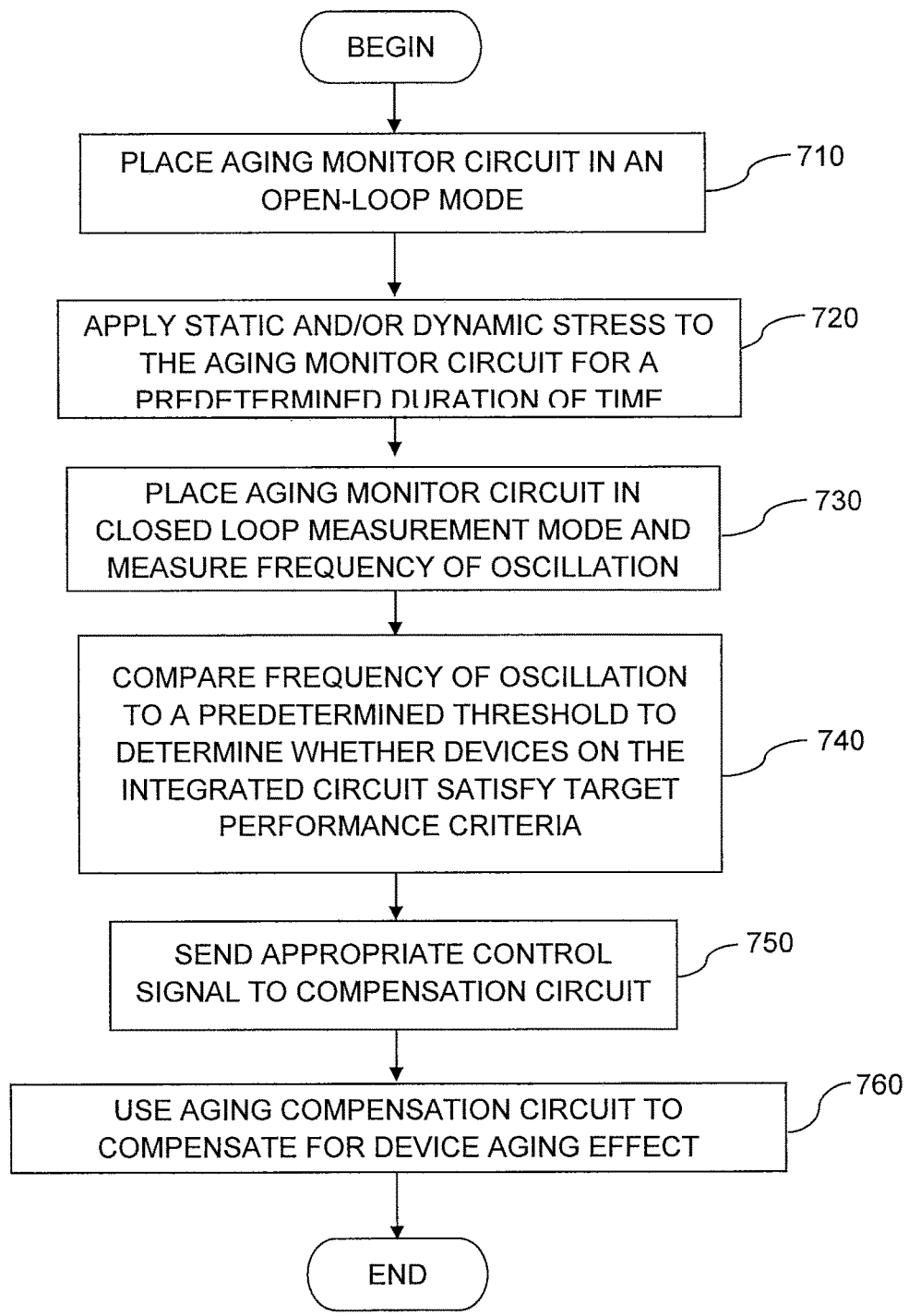
FIG. 7 is a flow chart of illustrative steps for monitoring aging effects and performing an aging compensation operation on an integrated circuit device in accordance with an embodiment of the present invention.

Illustrative steps involved in monitoring aging effects and performing an aging compensation operation on an integrated circuit are shown in FIG. 7. At step 710, aging monitor circuit is placed in an open-loop mode. For example, in the embodiment of FIG. 2, aging monitor circuit 101 may perform a stress test on aging sense circuit 203 by stressing aging sense circuit 203 with signal CLK and stress voltage $V_{STR}$. In one embodiment, the stress mode may be activated by setting signals EN_RO and EN_STR to a logic high level.

At step 720, static and/or dynamic stress signals are applied to the aging monitor circuit for a predetermined duration of time. In one embodiment, the static and/or dynamic stress signals may be applied for a predetermined duration of time that is based on commands received from a user of the integrated circuit. For example, in the embodiment of FIG. 5, signal CLK 506 may be transmitted to aging monitor circuit 503 via clock circuit 505. Aging monitor circuit 503 may be stressed for a period of time (e.g., time interval between $T_2$ to $T_3$ of FIG. 4) to allow the circuit to age.

At step 730, the aging monitor circuit is placed in a closed loop measurement mode and its oscillation frequency is measured. As shown in FIG. 3A, the closed loop measurement mode is activated in aging monitor circuit 301 by enabling feedback path 307 to transmit a resulting output signal (e.g., output signal OUT) back to aging sense circuit 303 based on signal EN_RO. Each output signal produced by aging sense circuit 303 may be inverted by inverter 40C, producing oscillations that may be measured for aging effect.

In one embodiment, the oscillation frequency may be compared to a predetermined threshold frequency to determine whether the devices on the integrated circuit satisfy specific performance criteria at step 740.

At step 750, an appropriate control signal is sent to a compensation circuit. For example, in the embodiment of FIG. 5, main control circuit 502 may generate a control signal that may be transmitted to aging compensation circuit 560 when the aging sense circuit (e.g., aging sense circuit 203 of FIG. 2) in aging monitor circuit 503 has degraded.

At step 760, aging compensation circuit 560 is used to compensate for device aging. As an example, when aging is detected in aging sense circuit 203, aging compensation circuit 560 may perform a suitable compensation operation, depending on the cause of aging and also the type of integrated circuit being tested. For example, in the embodiment of FIG. 5, aging compensation circuit 560 may increase the speed of the degraded aging sense circuit 203 by adjusting appropriate voltages (e.g., $V_{CC}$, pass gate control voltage, or body bias voltage). Other compensation operations may further include adjusting the operating frequency of aging sense circuit 503.

The method and apparatus described herein may be incorporated into any suitable circuit. For example, the method and apparatus may be incorporated into numerous types of devices such as microprocessors or other ICs. Exemplary ICs include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components: a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. An integrated circuit comprising:
a control circuit that receives a clock signal;
a sense circuit that receives the clock signal and that operates in at least a stress mode and a measurement mode, wherein the sense circuit and the control circuit have different structures, wherein the clock signal is routed through the control circuit to the sense circuit during the stress mode, and wherein changes in predetermined electrical parameters of one or more transistors in the sense circuit as a result of coupling the clock signal are measured during the measurement mode; and
a feedback path coupled between an output of the sense circuit and an input of the control circuit that enables a closed loop measurement mode for the sense circuit.

2. The integrated circuit defined in claim 1, wherein the control circuit obtains the clock signal at a plurality of different frequencies.

3. The integrated circuit defined in claim 1, wherein the sense circuit receives the clock signal only when the sense circuit is operating in the stress mode.

4. The integrated circuit defined in claim 1, wherein the sense circuit oscillates at a given frequency when the sense circuit is operating in the measurement mode.

5. The integrated circuit defined in claim 1 further comprising:
measurement circuitry that monitors a frequency of oscillation of the sense circuit when the sense circuit is operating in the measurement mode.

6. The integrated circuit defined in claim 5, wherein the measurement circuitry compares the frequency of oscillation with a predetermined frequency threshold to determine whether the sense circuit satisfies performance criteria.

7. A method for operating an integrated circuit, comprising:
with an aging monitor circuit, stressing a sense circuit in the aging monitor circuit by receiving a clock signal and by passing the clock signal through the sense circuit during an open loop stress mode; and
with measurement circuitry, monitoring the frequency oscillation of the sense circuit for aging effects during a closed loop measurement mode, wherein the sense circuit stops receiving the clock signal in the closed loop measurement mode.

8. The method defined in claim 7 wherein the clock signal has a plurality of different frequencies.

9. The method defined in claim 7 further comprising:
asserting first and second control signals to the aging monitor circuit with a control circuit, wherein the first control signal places the aging monitor circuit in the stress mode, and wherein the second control signal places the aging monitor circuit in the measurement mode.

10. The method defined in claim 9 wherein the sense circuit stops receiving the clock signal in response to the second control signal being asserted to place the aging monitor circuit in the measurement mode.

11. The method defined in claim 9 wherein the sense circuit oscillates at a given frequency when the sense circuit is placed in the measurement mode.

12. The method defined in claim 11 further comprising:
with measurement circuitry, monitoring the frequency of oscillation of the sense circuit for aging effects while the sense circuit is placed in measurement mode.

13. The method defined in claim 12 further comprising:
with the measurement circuitry, comparing the frequency of oscillation with a predetermined frequency threshold to determine whether the sense circuit satisfies performance criteria.

14. The method defined in claim 13, further comprising:
generating a signal with the measurement circuitry to notify a user of the integrated circuit that the sense circuit no longer satisfies performance criteria.

15. A method for monitoring aging effects on an integrated circuit, comprising:
with a sense circuit, receiving a clock signal for testing and outputting a signal having a frequency;
stressing the sense circuit by applying the received voltage to the sense circuit during a stress mode; and
with frequency measurement circuitry, monitoring the aging effects associated with the sense circuit by monitoring the frequency of the signal that is output from the sense circuit during the stress mode and during a measurement mode, wherein the sense circuit stops receiving the clock signal in the measurement mode.

16. The method defined in claim 15 wherein monitoring the frequency further comprises comparing frequency of oscillation to a predetermined frequency threshold to determine whether the sense circuit satisfies performance criteria with the frequency measurement circuitry.

17. The method defined in claim 16 wherein the integrated circuit receives a voltage, the method further comprising:
  stressing the sense circuit by applying the received voltage to the sense circuit.

18. The method defined in claim 17 further comprising:
  with an aging compensation circuit, performing aging compensation when aging effect is detected on the integrated circuit.

19. The method defined in claim 18 wherein performing aging compensation comprises adjusting the received voltage to satisfy performance criteria.

20. The method defined in claim 18 wherein performing aging compensation comprises adjusting the frequency of the received clock signal to meet timing constraints.

* * * * *